United States Patent [19]
Cottrell et al.

[11] Patent Number: 5,252,923
[45] Date of Patent: Oct. 12, 1993

[54] NUCLEAR MAGNETIC RESONANCE IMAGING METHODS

[75] Inventors: Stephen P. Cottrell, Taunton; Morley R. Halse, Herne Bay; John H. Strange, Canterbury, all of England

[73] Assignee: British Technology Group Limited, London, England

[21] Appl. No.: 781,135

[22] PCT Filed: Jun. 29, 1990

[86] PCT No.: PCT/GB90/01007

§ 371 Date: Dec. 27, 1991

§ 102(e) Date: Dec. 27, 1991

[87] PCT Pub. No.: WO91/00514

PCT Pub. Date: Jan. 10, 1991

[30] Foreign Application Priority Data

Jun. 30, 1989 [GB] United Kingdom ............... 8915090

[51] Int. Cl.$^5$ .......................................... G01R 33/20
[52] U.S. Cl. .................................................. 324/309
[58] Field of Search ............ 324/300, 307, 308, 309, 324/310, 311, 312, 313, 314, 318, 322

[56] References Cited

U.S. PATENT DOCUMENTS 4,509,015  4/1985  Ordidge et al. .................. 324/309
4,651,096  3/1987  Buonocore ....................... 324/307
4,748,410  5/1988  Macovski ......................... 324/309
4,812,760  3/1989  Bottomley et al. .............. 324/309
4,818,942  4/1989  Rzedzian ......................... 324/312
4,833,411  5/1989  McDonald et al. .............. 324/309

FOREIGN PATENT DOCUMENTS 0256779  2/1988  European Pat. Off. .
0301396  2/1989  European Pat. Off. .

OTHER PUBLICATIONS

Journal Magnetic Resonance 29, 1978, see IPER p. 2–pp. 365–366.

Primary Examiner—Michael J. Tokar
Attorney, Agent, or Firm—Cushman, Darby & Cushman

[57] ABSTRACT

To derive NMR imaging information, an object is subjected to a static magnetic field and a sinusoidally time-varying magnetic gradient field G. A 90° rf selective pulse P is applied around the time the gradient field G is zero and the subsequent free induction echoes E are detected and decoded. Additional non-selective pulses may be inserted at the times of echo peaks to refresh the echo signals. Additionally, to obtain two-dimensional information, the gradient direction of the magnetic gradient field may be changed in successive cycles of the sinusoidal field.

11 Claims, 1 Drawing Sheet

NUCLEAR MAGNETIC RESONANCE IMAGING METHODS

BACKGROUND OF THE INVENTION

1. Field of the Invention

This invention relates to NMR imaging methods and has particular application in methods of obtaining NMR imaging information from solid objects.

2. Description of the Related Art

The NMR imaging of solid materials has not been developed to the same level of sophistication as the NMR imaging of liquid and quasi-liquid materials. The principal difficulties with NMR imaging in solids arise because of the rapid rate of decay of the transverse magnetization. In other words, the characteristic spin-spin relaxation time, usually designated $T_2$, is short. To produce sufficient spatial localization of the selected nuclear spins in an object, large magnetic field gradients must be superimposed, which increases the rate of signal decay even further. In such circumstances much of the signal is lost in the dead time of the apparatus following the application of an rf excitation pulse. Also, the excitation pulse itself needs to be of large amplitude to excite resonance. Furthermore, because in solids the characteristic spin-lattice relaxation time $T_1$ is much longer than $T_2$, a considerable time interval of several $T_1$s, must elapse before an experiment can be repeated.

SUMMARY OF THE INVENTION

It is an object of the invention, to provide a method in which the above difficulties are overcome.

According to the invention a method of obtaining NMR imaging information from a solid object comprises subjecting an object to a static magnetic field, applying a 90° rf excitation pulse on the object in the presence of a sinusoidally varying magnetic gradient field so that gradient echoes of the free induction signal are formed by successive reversals of the gradient field, and detecting the echo signals so formed.

Preferably the relationship between the excitation pulse and the sinusoidally varying gradient field is such that the gradient field is substantially zero at the instant that the excitation pulse is applied. The excitation pulse is preferably a selective pulse. It can comprise a pulse sequence.

In carrying out the invention additional rf pulses can be applied at the instants of echo peaks. These additional pulses serve to maintain the amplitudes of the echo peaks. The rf phase of the additional pulses are preferably in quadrature to the rf phase of the excitation pulse. The additional pulses may be non-selective.

BRIEF DESCRIPTION OF THE DRAWINGS

In order that the invention may be more fully understood, reference will now be made to the accompanying drawing in which.

DETAILED DESCRIPTION OF THE PREFERRED EMBODIMENT

Figure 1:
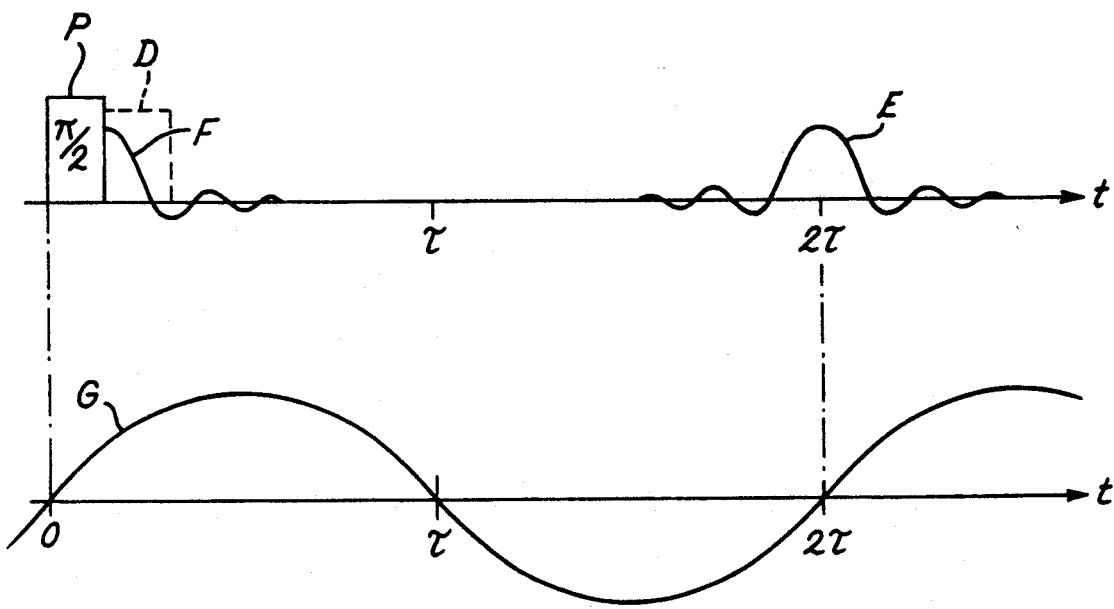
FIG. 1 illustrates diagrammatically a waveform of an experiment embodying the invention.

Referring now to FIG. 1, there is shown there in a time dependent magnetic gradient field G of sinusoidal shape. The power requirement to drive gradient coils to produce the sinusoidal waveform G can be reduced by incorporating capacitance and tuning the resulting system to resonance. The cycle time of waveform G is $2\tau$ and it passes through zero points at instants $\tau$ and multiples thereof measured from a start point 0. At time 0, a 90° rf selective excitation pulse P is applied. Pulse P is of an appropriate frequency to excite resonant nuclei in a slice in an object. A free induction decay signal F is generated. The time period over which the signal F is available in solids before it decays away is extremely short. The time period is further reduced by the 'dead' time D of the apparatus immediately following pulse P. It is not possible to use the apparatus in time D to detect signal F.

Due to the effect of the repetitive reversals of the gradient field G the initial signal F will be regenerated as a sequence of echo signal E with peaks at the time instant $2\tau$ and multiples thereof but with progressively decreasing peak magnitudes.

It will be seen that the first echo E and, of course, subsequent echoes occur well after the end of the dead time D. Furthermore since the 90° pulse P occurs when the amplitude of the field gradient G is at or near zero, the power requirement for the rf pulse is a minimum. The envelope of the echo signal E contains spatially encoded information relating to the spin density distribution of resonant nuclei in the solid object in the direction of the gradient field G. However the signal must be decoded, for example, by non-linear sampling, by taking into account the time dependence of the magnetic gradient field G and its magnitude.

The peaks of amplitude of successive echoes decay with characteristic time $T_2$. This decay is quite rapid in a solid but the decay rate can be slowed down by applying additional rf excitation pulses which act to refresh the echo signals E. These additional pulses are inserted at the times of echo peaks and are in rf phase quadrature with the original excitation pulse P.

The application of the additional pulses produces dead-time problems, obscuring part (or most) of the second half of each echo. Optimum results are achieved by collecting only the first half of each echo for data processing. An alternative procedure is to apply the rf pulses to coincide with alternate echoes provided the pulse separation is still shorter than or approximately equal to $T_2$. The intermediate echoes are used for data collection. The data from each detected echo is summed to improve the signal/noise ratio.

When a pulse starts at the peak of the echo the magnetization is spin-locked and the transverse magnetization decay due to the field gradient will not occur until after the end of the pulse provided that the amplitude $B_1$ of the pulse is large compared to $Gx$ where x is the sample dimension in the direction of the field gradient G. To minimize decay due to the dipolar interactions, $B_1$ must be larger than the dipolar local field. The pulse length should be very much shorter than $T_{1\rho}$, the characteristic spin-lattice relaxation time in the rotating reference frame.

After decoding the echo envelope to remove effects due to the time dependence of the field gradient, the decoded signal is subjected to a Fourier transformation in the usual way to produce the spatial distribution of resonant nuclei from a spin-echo envelope in an assumed constant linear magnetic field gradient.

The imaging information obtained by the methods described above relate to the spin distribution of the selected nuclei in the object in the direction of the magnetic gradient field. By changing the direction of the gradient field in successive cycles of that field, imaging information relating to corresponding different directions can be obtained and an entire two-dimensional image can then be produced by projection reconstruction. Decoding of the imaging information needs to take account of the decay of the echo amplitude envelope. In this way the two-dimensional information is acquired in a time of the order of the decay time of the transverse magnetisation, which is typically much less than one second.

We claim:

1. A method of obtaining NMR imaging information from a solid object comprising the steps of:
   applying a static magnetic field and a sinusoidally varying magnetic gradient field to an object;
   applying a single 90° rf excitation pulse, having an rf phase, to the object at a time when the sinusoidally varying magnetic gradient field is already being applied to the object to cause gradient echoes of a free induction signal to be formed by successive reversals of the sinusoidally varying magnetic gradient field; and
   detecting the formed gradient echoes.

2. The method as claimed in claim 1, the gradient field being substantially zero at the instant when the excitation pulse is applied to the object.

3. The method as claimed in either one of the preceding claims, the excitation pulse being a selective pulse.

4. The method as claimed in claim 1 or claim 2, additional rf pulses being applied to the object at instants of peaks of the gradient echoes.

5. The method as claimed in claim 4, rf phases of the additional rf pulses being in quadrature to the rf phase of the rf excitation pulse.

6. The method as claimed in claim 4, the additional rf pulses being nonselective.

7. The method as claimed in claim 1 or claim 2, the sinusoidally varying magnetic gradient field having a gradient direction changing in successive cycles thereof.

8. The method as claimed in claim 3, additional rf pulses being applied to the object at instants of peaks of the gradient echoes.

9. The method as claimed in claim 8, rf phrases of the additional rf pulses are in quadrature to the rf phase of the rf excitation pulse.

10. The method as claimed in claim 5, the additional rf pulses being non-selective.

11. The method as claimed in claim 3, the sinusoidally varying magnetic gradient field having a gradient direction changing in successive cycles thereof.

* * * * *